US007636903B2

(12) United States Patent
Baader et al.

(10) Patent No.: US 7,636,903 B2
(45) Date of Patent: *Dec. 22, 2009

(54) DEVICE AND METHOD FOR TESTING AN ELECTRIC CIRCUIT

(75) Inventors: Peter Baader, Munich (DE); Tilman Neunhoeffer, Unterhaching (DE)

(73) Assignee: Infineon Technologies AG, Munich (DE)

( * ) Notice: Subject to any disclaimer, the term of this patent is extended or adjusted under 35 U.S.C. 154(b) by 462 days.

This patent is subject to a terminal disclaimer.

(21) Appl. No.: 11/372,754

(22) Filed: Mar. 10, 2006

(65) Prior Publication Data

US 2006/0230372 A1 Oct. 12, 2006

Related U.S. Application Data

(63) Continuation of application No. PCT/DE2004/001951, filed on Aug. 31, 2004.

(30) Foreign Application Priority Data

Sep. 12, 2003 (DE) ................................ 103 43 344

(51) Int. Cl.
*G06F 17/50* (2006.01)
(52) U.S. Cl. ................ 716/4; 716/1; 716/3; 716/5; 702/57; 702/58; 702/59; 702/182; 702/183; 702/185; 702/186; 324/500; 324/512; 324/527; 324/528
(58) Field of Classification Search .............. 716/1, 716/3–5; 702/57–59, 182–183, 185–186; 324/500, 512, 527–528

See application file for complete search history.

(56) References Cited

U.S. PATENT DOCUMENTS 6,591,402 B1 7/2003 Chandra et al.

(Continued)

FOREIGN PATENT DOCUMENTS

DE 101 06 247 A1 10/2002

(Continued)

OTHER PUBLICATIONS

Bolsens, I., et al., "Electrical debugging of synchronous MOS VLSI circuits exploiting analysis of the intended logic behaviour," 26th ACM/IEEE Design Automation Conference, Jun. 25-Jun. 29, 1989 ACM, Paper 32.3, pp. 513-518.

(Continued)

*Primary Examiner*—Thuan Do
*Assistant Examiner*—Nghia M Doan
(74) *Attorney, Agent, or Firm*—Slater & Matsil, L.L.P.

(57) ABSTRACT

A method and device for testing an electric circuit, wherein exhaustive electric circuit modulation is not required yet circuit errors can be recognized in a reliable manner is provided. A marking signal is produced, indicating a predefined circuit state that might occur in specific components of an electric circuit, wherein a transformed network list is formed from an original network list describing the circuit, whereby all electric components of at least one predefined component group, with regard to a respective connection pair, are treated as short-circuited, all network nodes connected by one or several components that are to be treated as short-circuited are respectively combined to form an equivalence category, wherein respectively all states of the associated network nodes are assigned to each equivalence category, it is possible to determine whether and in which components the predefined circuit state can occur by taking into account the equivalence categories.

21 Claims, 13 Drawing Sheets

U.S. PATENT DOCUMENTS

| | | | |
|---|---|---|---|
| 7,313,498 B2* | 12/2007 | Baader et al. | 702/124 |
| 2003/0093504 A1* | 5/2003 | Neunhoeffer et al. | 709/220 |
| 2003/0120981 A1 | 6/2003 | Neunhoeffer et al. | |

FOREIGN PATENT DOCUMENTS

| | | |
|---|---|---|
| JP | 63-288368 A | 11/1988 |
| JP | 6-52253 | 2/1994 |
| JP | 11-186398 A | 7/1999 |
| JP | 2001-14368 | 1/2001 |

OTHER PUBLICATIONS

Dagenais, M.R., et al., "Transistor-Level Estimation of Worst-Case Delays in MOS VLSI Circuits," IEEE Transactions on Computer-Aided Design of Integrated Circuits and Systems, vol. 11, No. 3, Mar. 11, 1992, New York, pp. 384-395.

Hübner, U., et al., "Partitioning and Analysis of Static Digital CMOS Circuits," IEEE Transactions on Computer-Aided Design of Integrated Circuits and Systems, vol. 16, No. 11, Nov. 1997, pp. 1292-1310.

Auvergne, D., et al., "Formal Sizing Rules of CMOS Circuits," IEEE 1991, pp. 96-100.

Usami, K., et al., Clustered Voltage Scaling Technique for Low-Power Design, Proceedings of the ACM International Symposium on Low Power Electronics and Design, 1995, pp. 3-8.

Bolsens, I., et al., "Electrical debugging of synchronous MOS VLSI circuits exploiting analysis of the intended logic behaviour," $26^{th}$ ACM/IEEE Design Automation Conference, 1989, pp. 513-518.

Dagenais, M. R., et al., "Transistor-Level Estimation of Worst-Case Delays in MOS VLSI Circuits," IEEE Transactions of Computer-Aided Design, Mar. 1992, pp. 384-395, vol. 11, No. 3, IEEE.

Dally, W. J., et al., "A Hardware Architecture for Switch-Level Simulation," IEEE Transactions on Computer-Aided Design, pp. 239-250, Jul. 1985, vol. CAD-4, No. 3, IEEE.

* cited by examiner

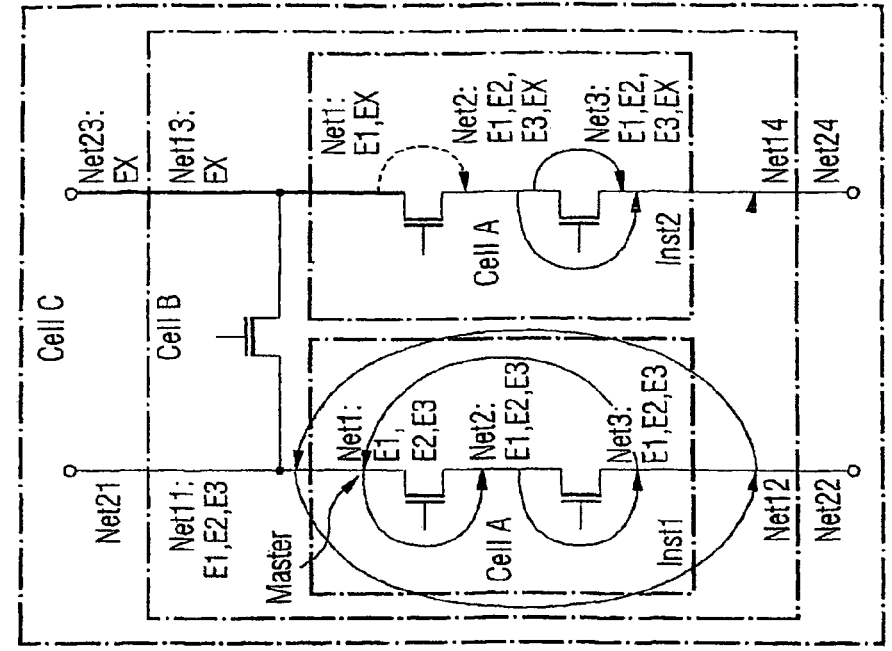
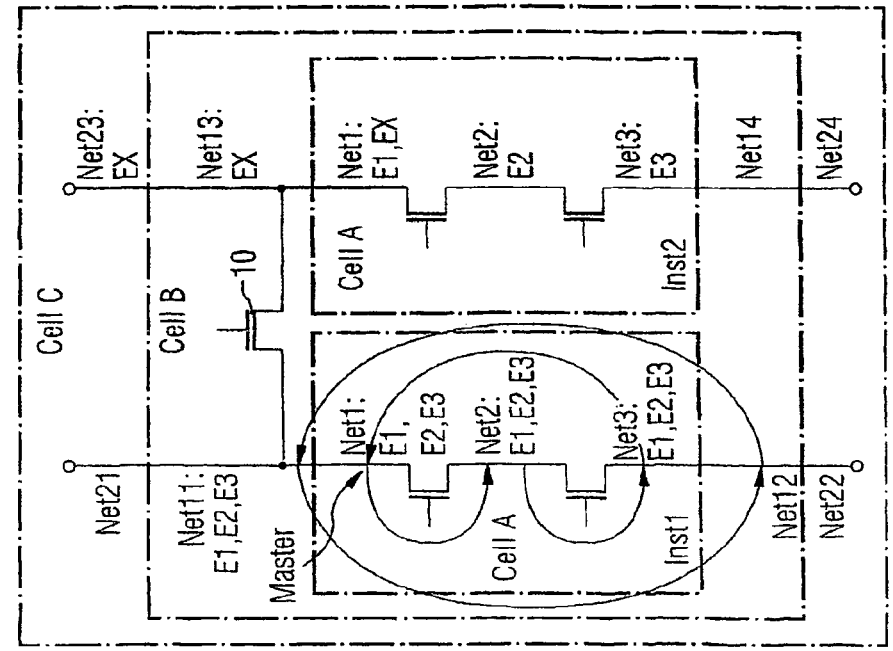
FIG 10
FIG 11

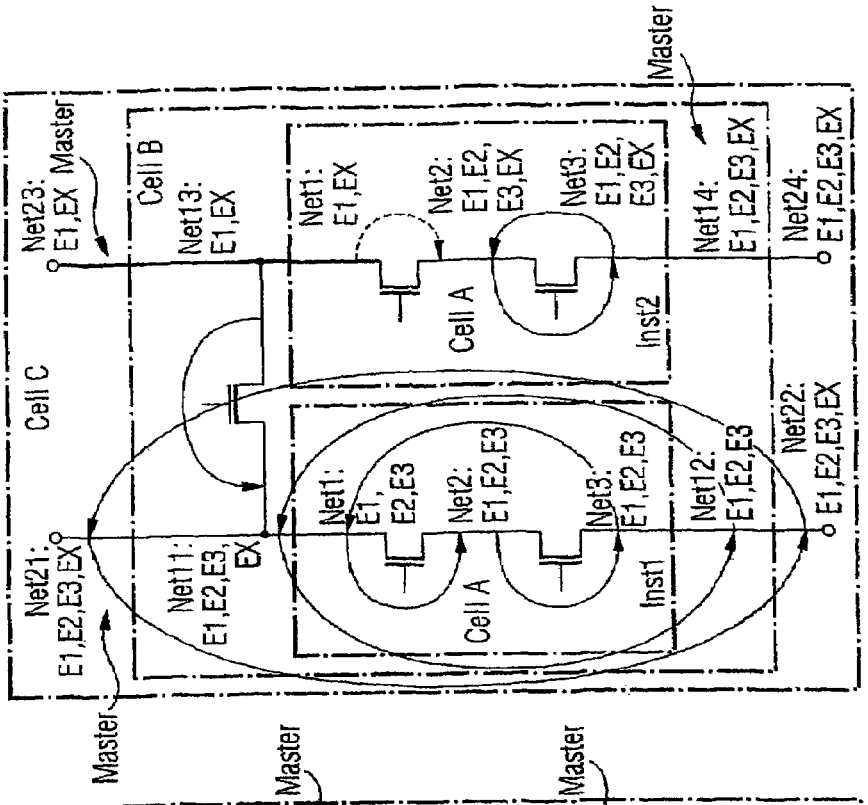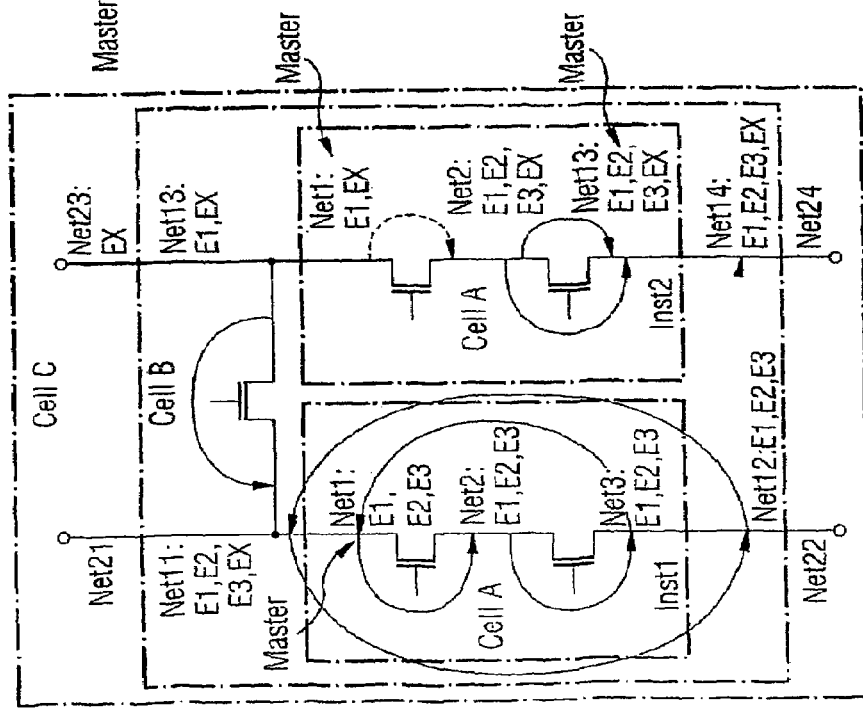

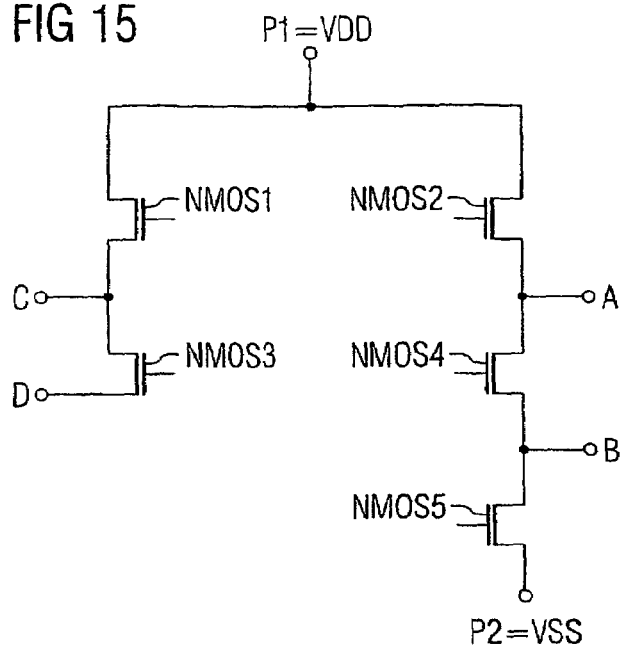
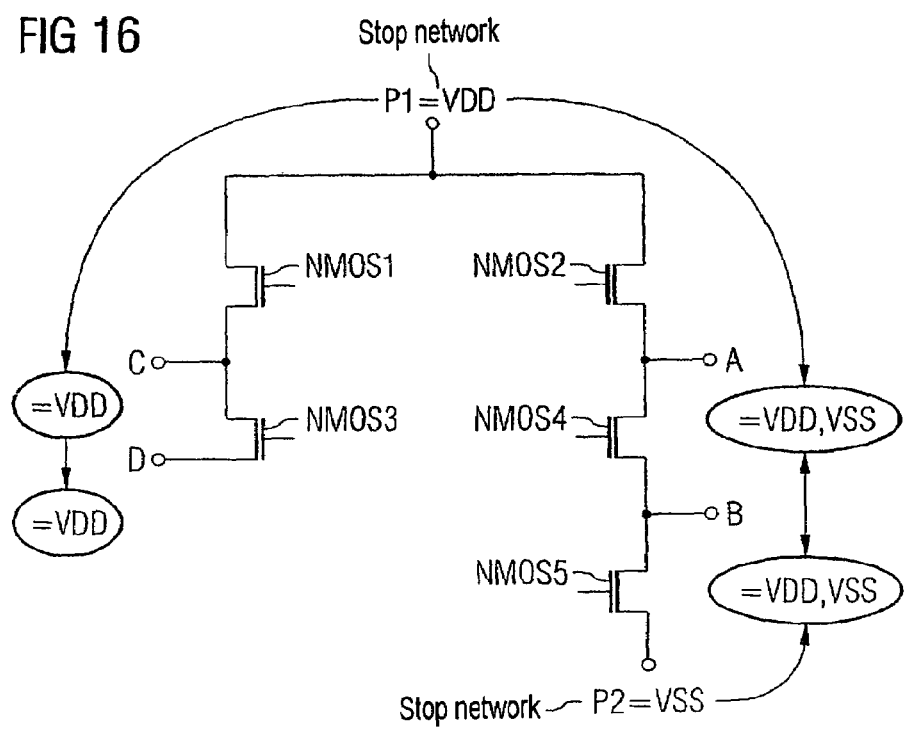

DEVICE AND METHOD FOR TESTING AN ELECTRIC CIRCUIT

This application is a continuation of co-pending International Application No. PCT/DE2004/001951, filed Aug. 31, 2004, which designated the United States and was not published in English, and which is based on German Application No. 103 43 344.9, filed Sep. 12, 2003, both of which applications are incorporated herein by reference.

TECHNICAL FIELD

This invention relates generally to electronic circuit devices and methods, and more specifically to devices and methods for testing electrical circuits.

BACKGROUND

To check a circuit, circuit simulations are usually performed in which the electrical behavior of the circuit is simulated. Although circuit simulations are useful for detecting weak points in the design of an electrical circuit, they have the disadvantage that the circuit behavior is only investigated in each case for one predetermined stimulus vector or one predetermined stimulus set of input voltages and/or other parameters (e.g., temperature, currents, etc.). Therefore, an error in the electrical circuit can only be found if the stimulus vector or stimulus set of parameters used in each case makes such demands on the circuit that a design error contained in the electrical circuit occurs and becomes detectable.

A further disadvantage of thorough circuit simulations is relatively high computing times.

SUMMARY OF THE INVENTION

Embodiments of the invention generally specify methods and devices for checking an electric circuit without a thorough electric circuit simulation and wherein circuit errors are reliably detected.

In accordance with an embodiment of the invention, a method for producing a marking signal indicating at which components of an electric circuit or in which circuit areas of the electric circuit a predetermined circuit state defined at least by a voltage potential or a logic state could occur is provided. The method comprises forming a transformed network list from an original network list describing the circuit structure of the electric circuit, wherein treating all electric components of the electric circuit of at least one predetermined component group or of at least one predetermined component type as short-circuited at least with regard to, in each case, one connection pair, combining all network nodes connected via one or several components that are to be treated as short-circuited to form an equivalence category, wherein, in each case, all voltage potentials or logic states of the associated network nodes are allocated to each equivalence category, determining, taking into consideration the equivalence categories, whether and in which components or in which circuit areas of the electric circuit the predefined circuit state can occur, and producing a signal that marks the components or circuit areas identified by means of the transformed network list in the original network list as the marking signal.

In accordance with another embodiment of the invention, a computer system for producing a marking signal indicating at which component of an electric circuit or in which circuit areas of the electric circuit a predefined circuit state defined at least by a voltage potential or a logic state might occur is provided. The computer system comprises a memory in which an original network list describing the circuit structure of the electric circuit is stored, and a processor, connected to the memory that forms a transformed network list from the original network list, whereby it treats all electric components of the electric circuit of at least a predefined component group or of at least a predefined component type as short-circuited, combines all network nodes, connected via one or several of the components to be treated as short-circuited, to form an equivalence category, allocates to each equivalence category all voltage potentials or logic states of the associated network nodes, determines, taking into consideration the equivalence categories, whether and at which components or in which circuit areas of the electric circuit the predetermined circuit state can occur, and produces as the marking signal a signal that marks the components or circuit areas in the original network list identified by means of the transformed network list.

In accordance with another embodiment of the invention, a data storage medium comprising a program that is designed in such a manner that a data processing system performs, after installation of the program, is provided. The method comprises forming a transformed network list from an original network list describing the circuit structure of the electric circuit, wherein treating all electric components of the electric circuit of at least one predetermined component group or of at least one predetermined component type as short-circuited at least with regard to, in each case, one connection pair, combining all network nodes connected via one or several components that are to be treated as short-circuited to form an equivalence category, wherein, in each case, all voltage potentials or logic states of the associated network nodes are allocated to each equivalence category, determining, taking into consideration the equivalence categories, whether and in which components or in which circuit areas of the electric circuit the predefined circuit state can occur, and producing a signal that marks the components or circuit areas identified by means of the transformed network list in the original network list as the marking signal.

In one aspect, an embodiment of the invention provides a method for generating a marking signal that specifies in which components of an electric circuit or in which circuit areas of the electric circuit a predetermined circuit state, defined at least by a voltage potential or by a logic state, could occur. In this method, a transformed network list is formed from an original network list describing the circuit structure of the electric circuit, whereby all electric components of the electric circuit of at least one predetermined component group or at least of one predetermined component type are treated as short circuited at least with respect to, in each case, one connection pair. All network nodes—also called "networks" for short in the text that follows—connected via one or more of the components to be treated as short circuited are, in each case, combined to form an equivalence category. An equivalence category is understood to be a "fictitious" equivalent network that replaces all associated networks during the further simulation. In this arrangement, all voltage potentials or logic states that could occur at one of the associated network nodes are, in each case, assigned to each equivalence category. Taking into consideration the equivalence categories thus formed, it is then determined whether and at which components or in which circuit areas of the electric circuit the predetermined circuit state can occur. A signal that marks the components or circuit areas identified by means of the transformed network list in the original network list and thus makes them identifiable is produced as the marking signal.

An advantage of an embodiment of the invention is that it can be performed in a very simple manner because the testing of the electric circuit is performed by means of a "transformed" or simplified network list. The transformed network list is formed by combining individual or several network nodes of the network list to form an equivalence category. Considered illustratively, an equivalence category is a new network or a new network node, respectively, which represents the "combined" network nodes or networks of the original network list. Combining networks in equivalence categories simplifies the original network list because fewer networks or network nodes overall need to be taken into consideration during the further testing. In other words, the test is performed on a simplified "equivalent circuit." Preferred embodiments generally perform the testing of the electric circuit by means of a transformed network list, which is simplified compared with the original network list.

A further advantage of an embodiment of the invention is that the transformed network list can be formed without great effort because only a predetermined "rule" is simply applied to the original network list. Such a rule contains that all electric components of at least a predetermined component group or of at least a predetermined component type are to be treated as short-circuited. The result is that at least all network nodes, which are connected via the correspondingly defined components, can be combined to form one equivalence category.

To achieve this, the marking signal actually defines an error with a particularly high probability and does not represent a "false alarm." It is considered to be advantageous, according to a development of the method, if, after the marking signal has been formed, it is checked or verified by means of the original network list whether the predetermined—for example critical—circuit state can actually occur in the components marked by the marking signal or in the circuit areas marked by the marking signal. Such verification can be performed, for example, by means of a thorough simulation of the part-areas of the electric circuit whereby the marked part-area of the electric circuit is separately simulated in detail.

If it is found during the verification that the predetermined circuit state does not occur in the components or circuit areas marked by the marking signal, the marking signal is preferably corrected by forming a corrected marking signal.

In order to prevent errors from occurring during the formation of the marking signal, it is considered to be advantageous separately to take into consideration so-called "stop networks." "Stop networks" are understood to be those network nodes or connecting pins of the electric circuit that are permanently assigned an electric voltage potential, a current or a logic state. Such stop networks should be excluded from being included in an equivalence category, because an assignment of other potentials or states than the permanently assigned potential or permanently assigned state would be inadmissible with such a "stop network." A "stop network" can be formed, for example, by an external connection or external pin of the electric circuit to which a fixed potential—for example ground potential or supply voltage potential—is permanently applied. In addition, "stop networks" can also be formed, for example, by voltage or current sources present in the electric circuit that provide fixed voltage potentials or currents within the circuit at predetermined networks. Since it is always fixed potentials or states that are assigned to stop networks, they should not be included in an equivalence category.

If it is found during the formation of equivalence categories that a "stop network" exists, the voltage potential, the current or the logic state of each of the "stop networks" is copied into each equivalence category connected to the "stop network." Thus, the potential or the state, respectively, of the "stop network" is exclusively copied in one direction, namely in the direction of the equivalence category. Reverse copying of the equivalence category to the "stop network" is impossible.

To avoid an electrical simulation of the electric circuit, it is considered to be advantageous according to a further development of the method if all electrical components of the electric circuit are treated either as short-circuited or as nonconductive individually for each component with respect to each connection pair of the components. In this development of the method, the electric circuit is only statically "simulated" because the components of the electric circuit are no longer simulated in detail but only treated as short-circuited or nonconductive overall. In the case of components with only two connections or connecting pins, the components are only treated as short-circuited or as nonconductive. In the case of components with a number of connections, the connecting links between all possible connection pairs are defined. For example, in the case of a component with three connections (e.g., transistor) A1, A2 and A3, it should thus be determined in each case for the links between connections A1-A2, A1-A3 and A2-A3 whether the connecting link is to be treated as short-circuited or as nonconductive. In the case of three connections, three determinations are thus required. In the case of a component with four connections (e.g., MOS transistor with substrate connection, thyristor) A1, A2, A3 and A4, it should thus be determined for the links between the connections A1-A2, A1-A3, A1-A4, A2-A3, A2-A4 and A3-A4 in each case whether the connecting link is to be treated as short-circuited or as nonconductive. Thus, six determinations are required in the case of four connections.

All transistors of at least one predetermined transistor type are preferably treated as short-circuited with respect to their switching junction. The term "switching junction" is understood to be the source-drain junction in the case of a field-effect transistor and the emitter-collector junction in the case of a bipolar transistor. In this embodiment of the method, it is taken into consideration that the switching junctions of transistors can usually be switched through so that it can be assumed that a potential or state present at one connection of the switching junction can also get to the other connection of the switching junction in each case. This situation is taken into account in the formation of equivalence categories by treating the switching junction as "short-circuited."

Regarding the treatment of resistances, it is considered to be advantageous if all resistances with a resistance value below a predetermined limit value are treated as short-circuited and all resistances having a resistance value above the predetermined limit value are treated as nonconductive. This procedure takes into account that, in the case of low-impedance resistors, a potential present at one connection of the resistance will also reach the other connection of the resistance virtually "unweakened" or unchanged. In the case of high-impedance resistances, however, there will be a distinct voltage drop so that a potential present at one connection of the resistance will not easily reach the other connection. In such a case, the resistance can be treated in a simplified manner as "non-conductive."

Accordingly, corresponding rules that specify whether and under what circumstances the connection pairs of the respective components are to be treated as short-circuited or as nonconductive, respectively, can be set up for any components of the electric circuit, that is to say also for exotic devices or components.

The preferred method according an embodiment of the invention for generating the marking signal is preferably used for those circuit states that are particularly critical and represent a circuit error.

Errors in the circuit design may occur, for example, in that, at a predetermined network node, the value reaches or drops below/exceeds a predetermined limit voltage potential or a predetermined limit current or a predetermined logic state is reached. The marking signal is preferably correspondingly generated when the value reaches or drops below/exceeds the, in each case, predetermined limit voltage potential for the predetermined network nodes, and thus for the predetermined equivalence categories, or the corresponding network nodes reach the respective predetermined logic state.

For the rest, there can also be an error in the circuit design if a voltage is present at selected components that reaches or drops below/exceeds a limit voltage individually predetermined for the components. Correspondingly, the marking signal is preferably generated when the value reaches or drops below/exceeds the state predetermined as critical for the predetermined components.

Limit voltages and limit states can be individually predetermined for each component. As an alternative, however, it is also possible to predetermine corresponding limit voltages for all components of a predetermined component type or component category and then to generate the marking signal for all those components of the associated component type or component category that drop below/exceed the limit value, in each case, predetermined for the component type or component category.

The method may be performed in a particularly simple and thus advantageous manner by means of a data processing system in which the circuit pattern of the electric circuit is input as original network lists.

In addition, embodiments of the invention are based on the aspect of specifying a device by means of which an electric circuit can be checked without requiring a thorough circuit simulation yet all circuit errors are to be reliably detected.

BRIEF DESCRIPTION OF THE DRAWINGS

In the text that follows, the invention will be explained by way of example with reference to five electric circuits, in which:

FIGS. 8 to 14 show an exemplary embodiment for an electric circuit with "stop network";

FIGS. 15 and 16 show a further exemplary embodiment for an electric circuit with "stop network";

DETAILED DESCRIPTION OF ILLUSTRATIVE EMBODIMENTS

Figure 2:
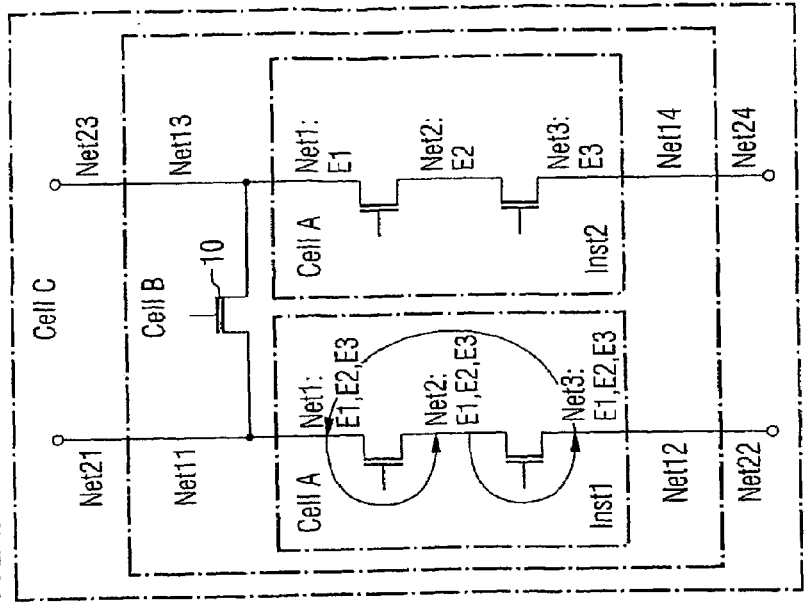
FIGS. 1 to 7 show an exemplary embodiment for an electric circuit without "stop network"

In an exemplary embodiment of the invention, explained in the text that follows, the electric circuit is described by means of a network list. In principle, the network list can have any data structure. The data structure used here in the context of the exemplary embodiment has the following format:

```
typedef struct noderec            /* Data structure of a network in a cell */
{
   ...
   netPinSetArray pinTypeSet;     /* PinTypes of the network or of the equivalent networks */
   netPinSetArray origPinTypeSet; /* PinTypes in the original network list */
   netPinSetArray eqPinTypeSet;   /* temporary for PinTypes in the equivalence ring */
   struct noderec *equivalent;    /* ring concatenation of equivalent nodes by
                                     short-circuited devices */
   equiMasterRefRec *equiMaster;  /* List of master networks of equivalent networks
                                     in various instantiations */
   equiMasterPinTypeRec *equiMasterPin;    /* for all equiMaster:
                                              PinTypes for equivalent networks */
   ...
}
typedef long netPinSetArray[PINSET_SIZE];  /* several PinTypes (such as, e.g. VDD, IN,
                                              OUT, ... or different voltage levels can
                                              be stored */
   /* Masternode in the instance instId */
struct equiMasterRefRec
{
   struct equiMasterRefRec *next;
   noderec      *master;
   long         instId;
};
/* PinTypes of all equivalent networks of the master in the instance instId */
struct equiMasterPinTypeRec
{
   struct equiMasterPinTypeRec *next;
   netPinSetArray   equiPinTypeSet;
   long             instId;
};
```

With this data structure, each network or each network node contains a pointer that is designated by the word "equivalent." This "equivalent" pointer is used for the temporary ring concatenation of all equivalent networks, i.e., of all networks belonging to an equivalence category. If an equivalence category is formed, a network, a so-called master, is selected in this category. Because the equivalence categories in a cell can be different from instantiation to instantiation, pointers to the respective master of the equivalence category to which the network belongs are stored for each instantiation of a cell in the equiMaster list per network. The terms "equivalence ring" and "equivalence category" will be used synonymously in the text that follows.

Pintypes of each equivalence ring are stored in the variable "equiMasterPin." Each network in the equivalence ring exhibits such an "equiMasterPin" pintype.

The pintype of each network is stored in the variable "origPinTypeSet" in the original network list. The variable "pinTypeSet" contains the pintype of the network valid in the, in each case, current state of the network list—that is to say, for example, in dependence on which components of the electric circuit are considered to be short-circuited or nonconductive.

Using the described data structure of the network of the network list as a basis, two separate recursive runs through the instances are needed. In the text that follows, the first one of these two recursive runs is designated as step I and the second one of the two recursive runs is designated as step II. This requires two recursive runs because the network characteristics should be transported through the hierarchy of the network list.

In the text that follows, the steps will first be explained in a general abstract form. Following this, the figures are used for showing in detail how the steps are applied.

In step I, the pintypes of the individual networks are first handed down from top to bottom "top-down." After that, the equivalence categories are combined "bottom-up" and the pintypes are pushed to the top.

In step II, the pintypes are first handed down from top to bottom "top-down," this time already taking into account the pintypes of the modified network list, i.e., the equivalence categories or equivalence rings, respectively. Following this, the tests are then performed "bottom-up" with the modified network list.

In detail, steps I and II are performed as follows:

Step I:

Step I comprises the recursive call-up of the functions for generating the equivalences for all instances. During this process, the following individual steps are performed:

I.1. In this step, an instance-by-instance initialization is performed before the hierarchical descent in top-down order. During this process, the pintypes of the networks are handed down.

I.2. In this step, the equivalence categories are built up in dependence on instance in a bottom-up order. The network list is supplemented by concatenating short-circuited components of the electric circuit in equivalence rings or equivalence categories, respectively. This does not affect the original network list. Starting with the original network list, it is only necessary to perform a corresponding transformation or, respectively, a corresponding "walk" over the equivalence rings in order to be able to access the modified network list. As an alternative, an independent modified network list can also be correspondingly generated and stored.

I.2.1. For all components specified in a predetermined rule file for the electric circuit, which are treated as short-circuited with respect to one or more connection pairs, the associated networks or network nodes are made equivalent and concatenated. This can be not only components in a cell but also a cell itself in which the associated pins are made equivalent. The term "make equivalent" is understood to mean that, in each case, all states (potentials, logic states, etc.) of all remaining network nodes of the associated equivalence category are assigned to each network node.

If a network at a component to be treated as short-circuited is a stop network, the network is not also included into the equivalence ring. Instead, the pintype of the stop network is copied into the equivalence ring; this is because, although the networks in the equivalence ring are allowed to accept the respective network characteristics, they do not forward these unrestrictedly. Taking into consideration "stop networks," the method becomes instance-dependent.

Following this, the switching junction, for example, the source-drain junction in the case of field-effect transistors and the base-emitter junction in the case of bipolar transistors, is treated as short-circuited. Resistances are considered to be short-circuited or nonconductive depending on the size of the resistance value.

I.2.2. In this step, one node is determined to be the master for each equivalence category. In this master, all pintypes of the equivalence ring are entered. The master selected is preferably such a network that has a connection into a higher cell, that is to say, for example, to an external network or to a pin, respectively. If no such network exists, an arbitrary network of the equivalence ring is selected.

I.2.3. For all master networks, the variable "equiMasterPin" is created in this step and occupied with the temporarily created variable "equiPinTypeSet" of the master.

I.2.4. All networks in the parent cell that are connected via local equivalence rings in the current cell are concatenated in an equivalence ring. The variable "equiPinTypeSet" of a sub-network is transferred to the respective connected network in the parent cell.

Step II:

In step II, a recursive run through the hierarchy and a call-up of the check functions for all instances is performed. During this process, the following individual steps are processed in succession per instance:

II.1. The pintypes of the equivalence categories are handed down into the instances top-down.

II.2.1. The equivalence categories are updated by loading the data for the respective instance from the equiMaster list.

II.2.2. All tests are activated bottom-up in the instance.

The method steps I and II, explained in an abstract, general form, will now be explained in detail with reference to the circuit examples shown in the figures.

Figure 1:
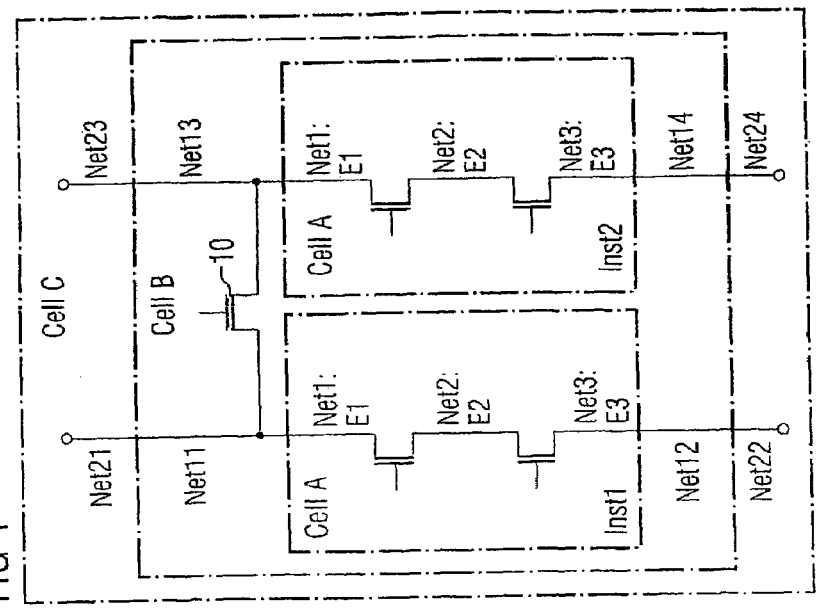

In FIG. 1, two cells A can be seen that are, in each case, formed by two series-connected transistors. The left-hand cell A in FIG. 1 forms instance 1 (Inst1) and the right-hand cell A in FIG. 1 forms instance 2 (Inst2).

As can be seen from FIG. 1, each of the two instances 1 and 2 or, respectively, cell A, in each case, exhibits three networks Net1, Net2 and Net3. Each of these networks Net1, Net2 and Net3 has a characteristic that is designated by E1, E2 or E3.

Such a characteristic can be, for example, a pintype such as "VDD" (equals supply voltage) or another voltage such as, for example, 2.8 V.

Cell A appears twice in cell B as instance Inst1 and instance Inst2. In addition, cell B has a transistor 10 that is connected to the networks Net11 and Net13. The four networks Net11, Net12, Net13 and Net14 also form connecting networks, in each case, between cells A and C. Cell C has the networks Net21, Net22, Net23 and Net24, which connect cell B inserted into cell C to cell C.

FIG. 2 then shows step I for instance Inst1 of cell A. The step is performed in bottom-up order. Within this step, all networks present at the two transistors of cell A of instance Inst1 are combined in an equivalence ring (step I.2.1) because the two transistors of cell A are treated as short-circuited. The characteristics of networks Net1, Net2 and Net3 are distributed to all networks in the equivalence ring. This means that each of the three networks Net1, Net2 and Net3, in each case, has three characteristics, namely characteristics E1, E2, E3.

Figure 3:
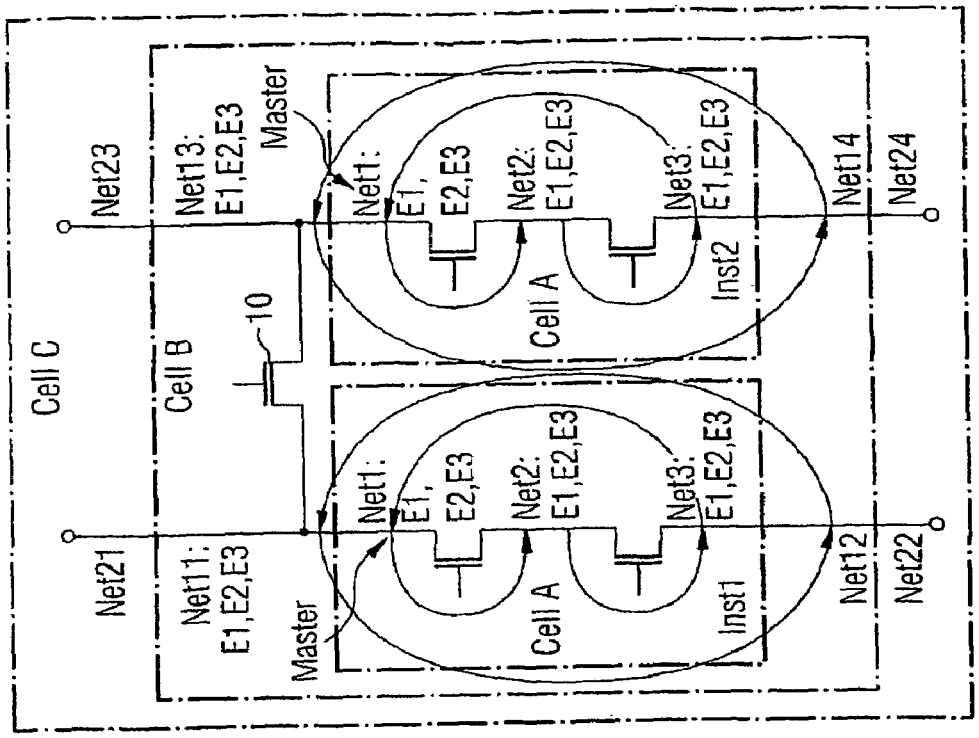

FIG. 3 shows how step I.2.2 is performed in detail. The two networks Net11 and Net12 are connected in cell B to the equivalence ring of cell A of instance Inst1. For this reason, the two networks Net11 and Net12 come into an equivalence ring in cell B. The network characteristics of the previously formed equivalence ring of cell A of instance Inst1 are transferred from network Net1 to network Net11; this is because network Net1 has previously been selected as master according to step I.2.2. As a result, network Net11 then has the characteristics E1, E2 and E3.

Figure 4:
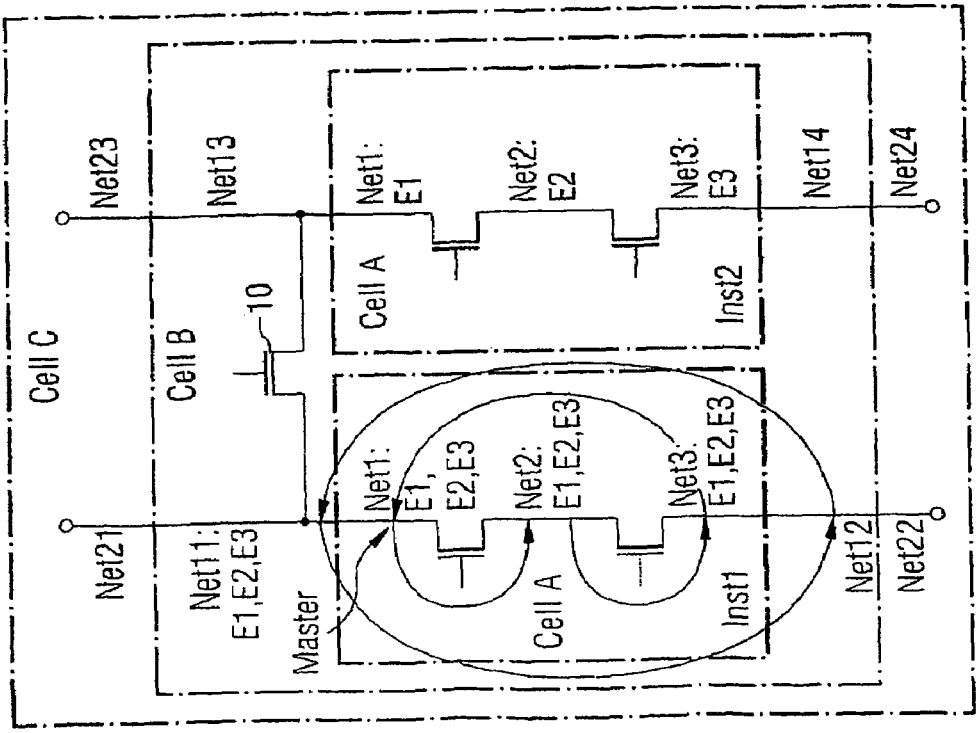

In FIG. 4, the performance of the corresponding steps is described for cell A of instance Inst2. In this cell, too, processing is performed in bottom-up order.

Figure 5:
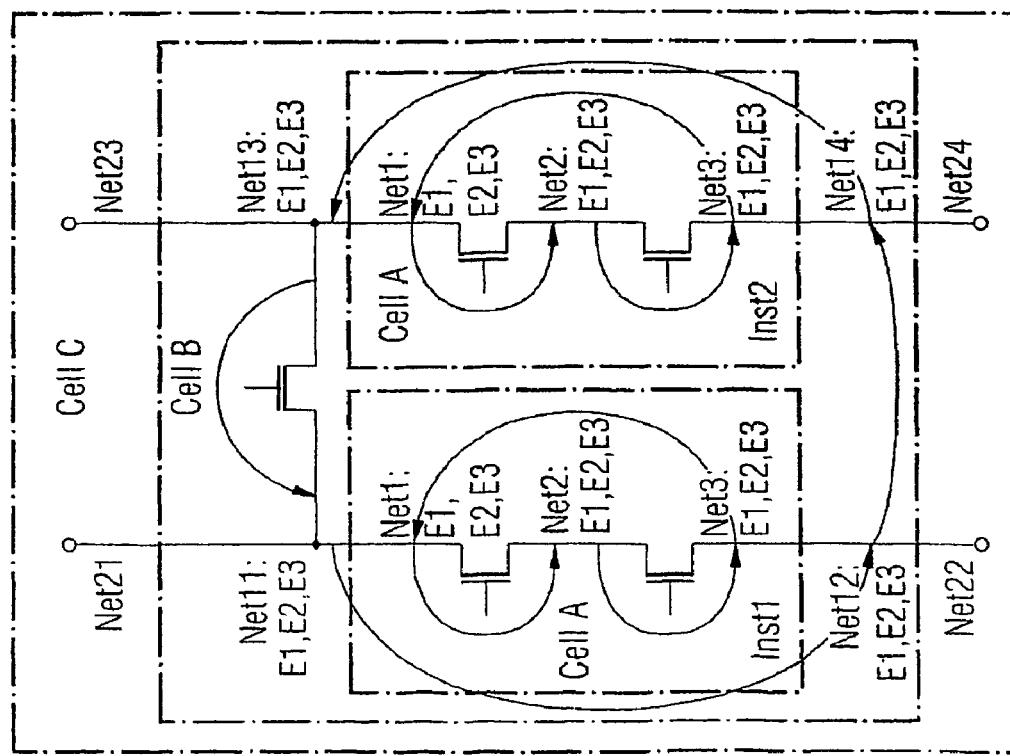

FIG. 5 shows step I for cell B. It can be seen that the networks Net11, Net12, Net13 and Net14 are combined in an equivalence ring as has been explained above in connection with step I.2.1. At the same time, the network characteristics of these networks are transferred to all networks in the ring of cell B.

As a result, it can be found that networks Net1, Net2 and Net3 and networks Net11, Net12, Net13 and Net14 now, in each case, can exhibit the three characteristics E1, E2 and E3.

Figure 6:
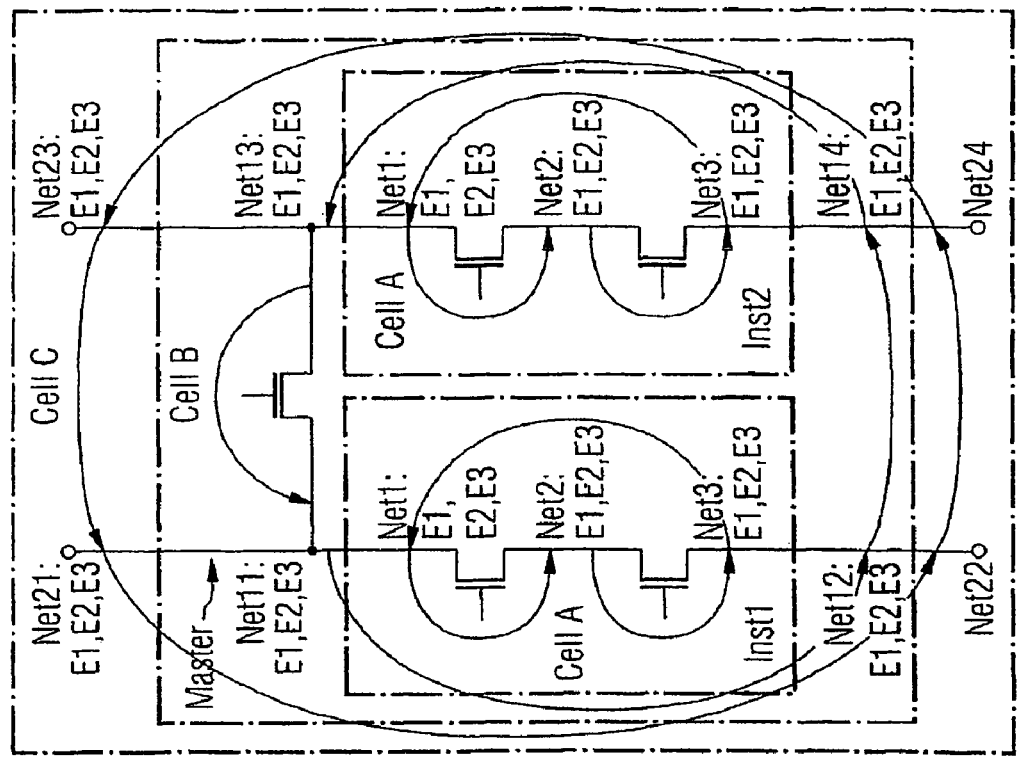

FIG. 6 shows step I.2.4 for cell B. The networks Net21, Net22, Net23 and Net24 are connected by the equivalence ring in cell B. At the same time, the network characteristics of the equivalence ring in cell B are transferred from network Net11, which was selected as master according to step I.2.2, to network Net21. Network Net21 now has the characteristics E1, E2 and E3.

Figure 7:
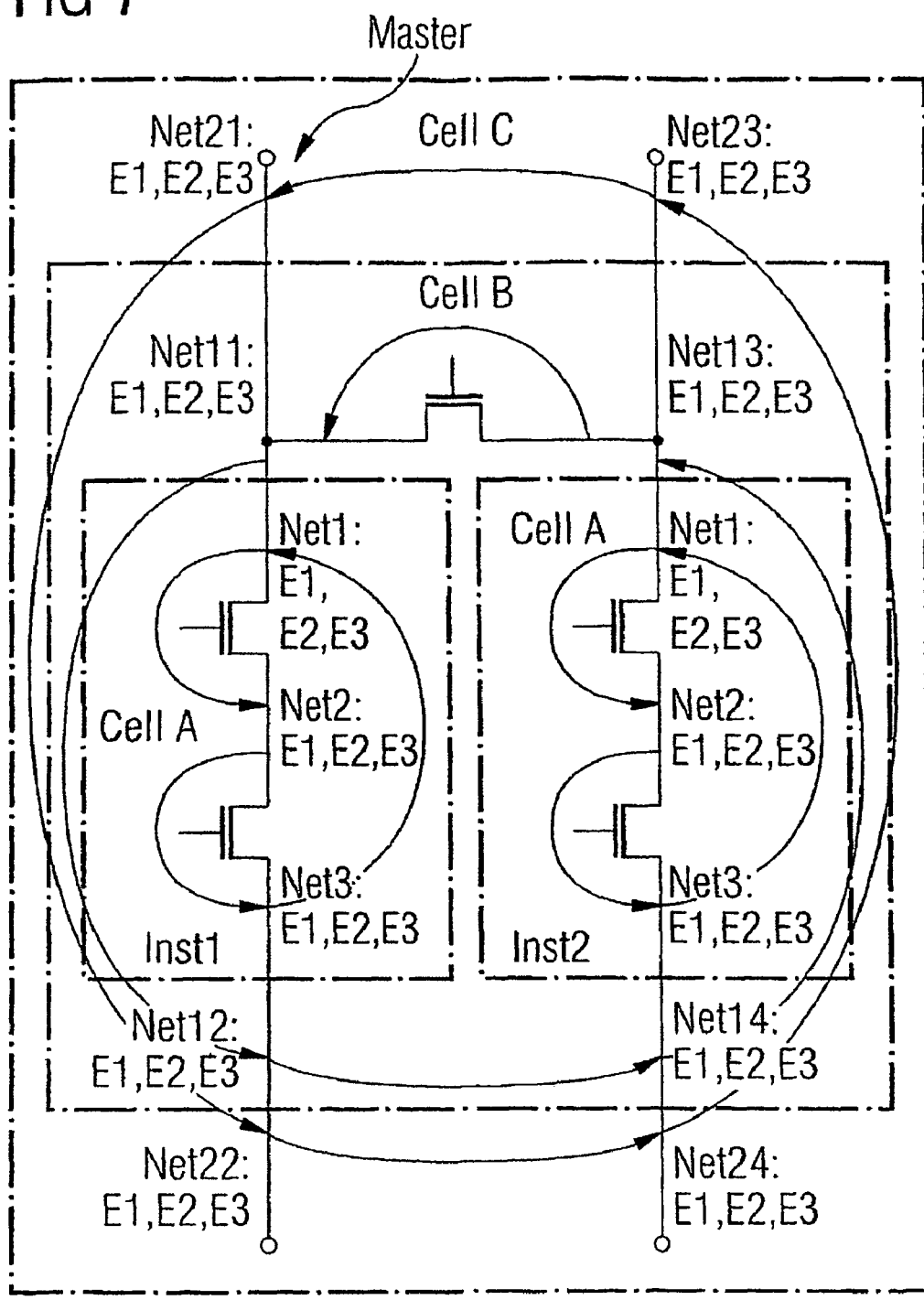

FIG. 7 shows the result of the formation of equivalence categories by transferring the network characteristics. All networks within cell C now have the characteristics E1, E2 and E3. The transformed network list formed by the equivalence category or, respectively, by the equivalence rings can now be tested according to test step II. The original network list is still available.

As a result, it can thus be stated that due to the assignment of network characteristics to networks, shown in FIGS. 1-7, a transformed network list is formed that can be used for test purposes and for generating a marking signal that marks the occurrence of a predetermined circuit state.

In the exemplary embodiment according to FIGS. 1-7, it was possible to assign each characteristic to each of the networks of cell C because none of the networks formed a so-called "stop network." In connection with FIGS. 8-14, it will now be explained how the method for generating a marking signal can be performed, for example, in electric circuits in the network list of which so-called "stop networks" should be taken into consideration.

Figure 8:
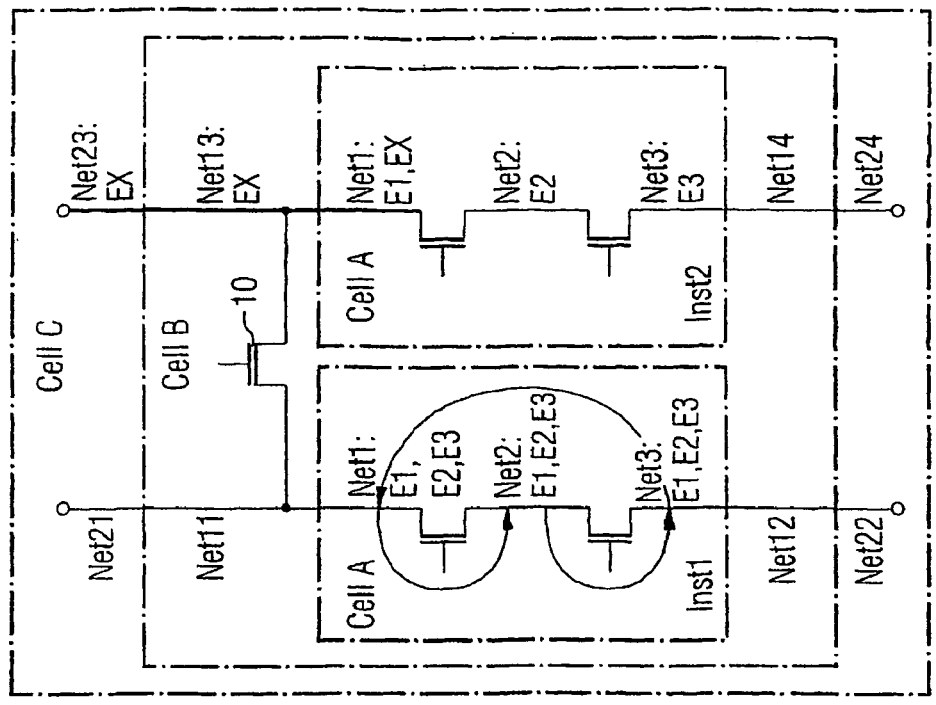

FIG. 8 shows the same initial circuit as in FIG. 1. However, the circuit according to FIG. 8 differs from the circuit according FIG. 1 in that the network Net23 is now a "stop network." This means that a network characteristic, for example an electrical voltage potential, a current or a logic state is permanently assigned to the network Net23. Network Net23 can thus not exhibit any other characteristics than the predetermined characteristic. In the text that follows, the network characteristic of network Net23 is designated as "EX." In step I, the network characteristic EX is copied to the networks connected to the "stop network" Net23 via the hierarchy. This is shown in FIG. 8. FIG. 8 shows that the network characteristic EX is copied to the networks Net13 in cell B and Net1 in instance Inst2 of cell A, connected to the network Net23.

Figure 9:
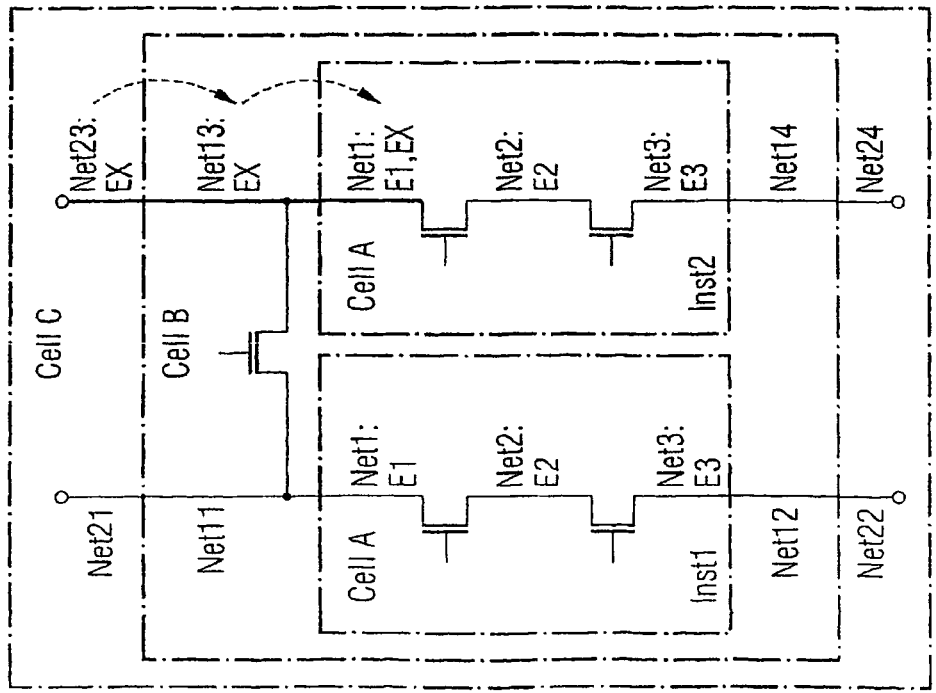

In FIG. 9 and FIG. 10, the steps already explained in connection with FIGS. 2 and 3 in the first exemplary embodiment are performed in corresponding or identical manner, respectively. At this time, the stop network Net13 does not yet play a role. It can thus be seen that the network characteristics E1, E2 and E3 are, in each case, assigned to networks Net1, Net2 and Net3 of cell A of instance Inst1. In addition, network Net1 is selected as master.

FIG. 11 shows step I for instance Inst2 of cell A. The networks Net2 and Net3, present at the bottom transistor of instance Inst2, are combined in an equivalence ring (compare step I.2.1). The characteristics of networks Net2 and Net3 are distributed to the two networks Net2 and Net3 in the equivalence ring. This means that the two networks Net2 and Net3 now have the characteristics E1, E2, E3 and EX. Network Net1 is not also included in the equivalence ring because it is a stop network. However, the network characteristics of network Net1 (the characteristics E1 and EX) have been copied into the equivalence ring so that they are also present at the two networks Net2 and Net3.

FIG. 12 shows step I.2.4 for the instance Inst2 of cell A. The network characteristics of the equivalence ring of cell A of instance Inst2 are transferred from network Net3, which has been selected as master according to step I.2.2, to network Net14. Network Net14 now has the characteristics E1, E2, E3 and EX. Similarly, the network characteristics of the master network Net1 are transferred to Net13. Because the network Net13 is a "stop network," this network Net 13 is not included in any equivalence ring; only the network characteristics of network Net13 are transferred to network Net11.

FIG. 13 shows the result of the formation of equivalence and transfer of the network characteristics. The networks Net21, Net22 and Net24 of cell C now have the characteristics E1, E2, E3 and EX. The stop network Net23, in contrast, only has the characteristics E1 and EX.

Figure 14:
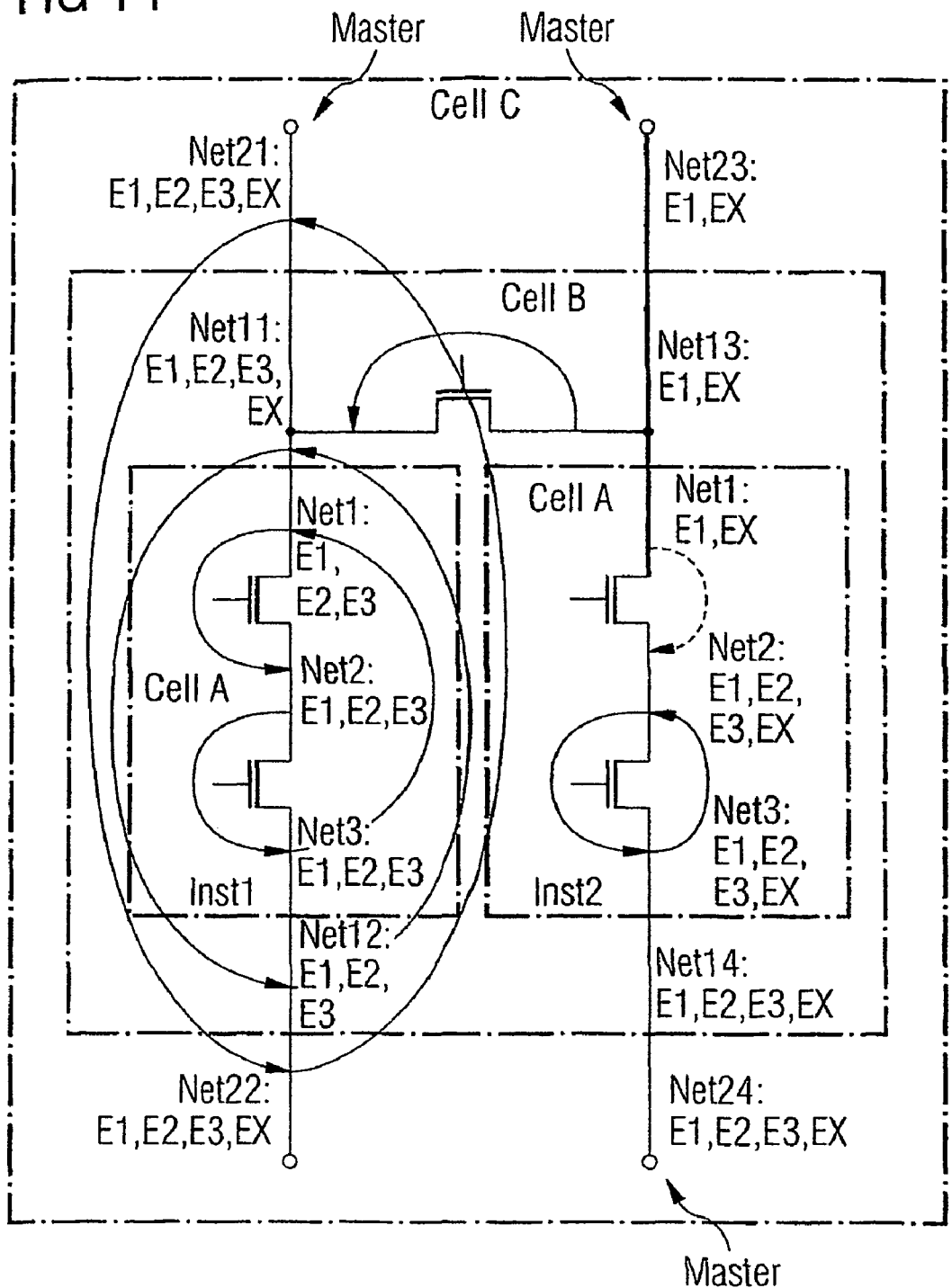

FIG. 14 shows the final result of the formation of equivalence. In contrast to the first exemplary embodiment—compare, in particular FIG. 7 —, in which no stop network existed, there are now three master networks, i.e., three new equivalence categories, not connected to one another, or, respectively, three "new" networks. The stop network Net23 and the networks Net13 and Net1 connected to it have not changed their original network characteristic. Nevertheless, network Net23 has forwarded its characteristic EX to the other networks.

In summary, the method explained in conjunction with FIGS. 1-14 thus consists of transforming an original list into a transformed network list, the original network list is retained. Retention of the original network list is of importance because the cross-reference to the original network list is to be retained during the error output. For example, the original network list is needed for graphical "probing" or "testing." In addition, the components and networks in which critical circuit states can occur should preferably always be reported in an original network list because it is only the original network list that exhibits a direct cross reference to the actual circuit design.

In the newly formed, modified or, respectively, transformed network list, the network characteristics of the previous networks are taken over. Because a number of "old" networks are transferred into a "new" network, a new network can assume a number of different network characteristics (for example, a number of voltages, a number of logic states, etc.). The network characteristics can be transported or copied over various components of the electric circuit by forming the equivalence categories explained.

The method described is thus distinguished by the fact that all networks that are connected by components of the electric circuit that are to be considered as short-circuited are combined in equivalence categories. Each equivalence category represents a new logical or electric network. The equivalence categories are formed over the respective circuit hierarchy. During this process, "stop networks" are taken into consideration that are not also received into the equivalence category.

Instead, only the pintype of the stop network is copied into the respective equivalence category as a result of which the pintypes of all "stop networks" present are known in the equivalence category. In addition, the equivalence categories of the sub-networks are taken into consideration. As a result, the method becomes instance-dependent and no longer cell-dependent. This means, for example, that one and the same cell can be connected differently in different instances. If they are stop networks that are not also received in an equivalence category, this is taken into consideration during the transfer of characteristics of networks.

An advantage of the method explained is the possibility of rapidly transforming a network list according to the requirements in a separate "rule file" into another one and to use this transformed network list for the static checking of electrical characteristics.

If, during the performance of the method—as described in conjunction with the examples according to FIGS. 1 and 14—all components are considered to be short-circuited or nonconductive, a complete static check of the electric characteristics of the electric circuit can be performed with the aid of the transformed network list. Such a static check of the electric circuit has a distinctly higher speed and a distinctly better test coverage than would be possible with a dynamic, detailed electrical simulation of the electric circuit. Due to the "cross reference" to the original list, it remains possible to assign detected errors to the circuit areas of the circuit affected in each case. In addition, the method described can also be applied in hierarchical network lists.

In conjunction with FIGS. 15 to 19, it is now intended to explain, for example, how a marking signal can be generated by means of the transformed or modified network list.

FIG. 15 shows five MOS transistors NMOS1, NMOS2, NMOS3, NMOS4 and NMOS5. In this arrangement, a switching junction connection (i.e., source or drain connection) of transistor NMOS5 is connected to a network node or to a network with the designation P2. Another connection of transistor NMOS5 is connected to a network B that is also connected to a switching junction connection of transistor NMOS4. The other switching junction connection of transistor NMOS4 is connected to a switching junction connection of transistor NMOS2 and to a network A. The other switching junction connection of transistor NMOS2 is connected to a switching junction connection of transistor NMOS1 and to a network P1. The other switching junction connection of transistor NMOS1 is electrically connected to a switching junction connection of transistor NMOS3 and to a network C. The other switching junction connection of transistor NMOS3 forms a network D.

The two networks or network nodes P1 and P2 are, in each case, permanently assigned an electrical state variable, namely the supply voltage VDD to the network P1 and the ground potential VSS to the network P2.

In addition, the five transistors NMOS1 to NMOS5 are treated as short-circuited. The permanent assignment of the electrical state variables for the two networks P1 and P2, and the treatment of transistors NMOS1 to NMOS5 as short-circuited, can be achieved, for example, by the following programming instruction:

```
ercDefines(
    defPins(
        pin "VSS" = "P2"
        pin "VDD" = "P1"
    )
    shortDevices(
        short "MOS"
        excludingPinTypes "VSS" "VDD"
    )
)
```

Due to the fact that the five transistors NMOS1 to NMOS5 are treated as short-circuited, the voltage potentials VDD and VSS at the two networks P1 and P2 can now be assigned to all those networks that are connected to networks P1 and P2 via the transistors.

In this context, it should be taken into consideration, however, that the two networks P1 and P2 have permanently assigned electrical potentials, namely the potentials VDD and VSS, so that these two networks P1 and P2 should be considered as so-called "stop networks."

This means that the potential VSS at network P2 passes via transistor NMOS5, to be treated as short-circuited, to network B and via the transistor NMOS4, to be treated as short-circuited, to network A or is "propagated" to the latter. Thus, the potential VSS is in each case assigned to the two networks A and B. The potential VDD will pass correspondingly from network P1 via the transistor NMOS2, to be treated as short-circuited, to network A and via transistor NMOS4, to be treated as short-circuited, to network B. Thus, the two potentials VSS and VDD are, in each case, assigned to the two networks A and B.

As can be seen in FIG. 16, however, there is no allocation of the potential VDD to network P2, neither is there any allocation of potential VSS to the potential P1. The reason for this is that the two networks P1 and P2 form "stop networks" in which an electrical state variable is permanently assigned. In the example according to FIGS. 15 and 16, the potential VDD is permanently assigned to network P1 and the potential VSS is permanently assigned to network P2 as stated above.

The potential VDD is then correspondingly assigned to network C via the transistor NMOS1, treated as short-circuited. Thus, the potential VDD should also be assigned to network D since transistor NMOS3 also is to be treated as short-circuited.

As a result, an association of voltage potentials as shown in FIG. 16 is thus formed. This means that the potentials VSS and VDD are, in each case, assigned to the two networks A and B and the potential VDD is, in each case, assigned to the two networks C and D. The two networks P1 and P2 retain their permanently assigned potentials VDD and VSS, respectively, since they are stop networks. The following thus applies:

P1: VDD
P2: VSS
A: VDD, VSS
B: VDD, VSS
C: VDD
D: VDD

Thus, networks C and D, on the one hand, and, on the other hand, networks A and B, in each case, form one equivalence category.

The electric circuit according to FIGS. 15 and 16 can now be checked for whether a predetermined circuit state, which is at least defined by an electric state variable, has been reached. This will be explained with reference to an example in which a marking signal (or test signal, respectively) is output for all those nodes that do not have a connection to the potential VDD or connection to the potential VSS. In a programming language, a corresponding enquiry could be as follows:

```
ercRules(
    reportNet(
        pinTypes
        condition count "VSS" "VDD" ≦ 1
        title "No path to VDD or no path to VSS"
    )
)
```

As can be seen in FIG. 16, networks P1, P2, C and D are reported. Networks P1 and P2 are reported since they are stop networks and cannot accept any other potential. Networks C and D are reported since they cannot accept the potential VSS. Thus, a test signal is generated.

Another test enquiry could be, for example, that all networks or network nodes should be output that can be at the potential VSS. In a programming language, the corresponding search or test enquiry could be as follows:

```
ercRules(
    reportNet(
        pinTypes
        condition
        including "VSS"
        title "path to VSS"
    )
)
```

The result of this test enquiry would be that networks A and B and P2 can have potential VSS. As stated above, the network P1 cannot have the potential VSS since this is a stop network. Correspondingly, the two networks C and D cannot have the potential VSS, either, since only the potential VDD is applied to them via the stop network P1.

Figure 17:
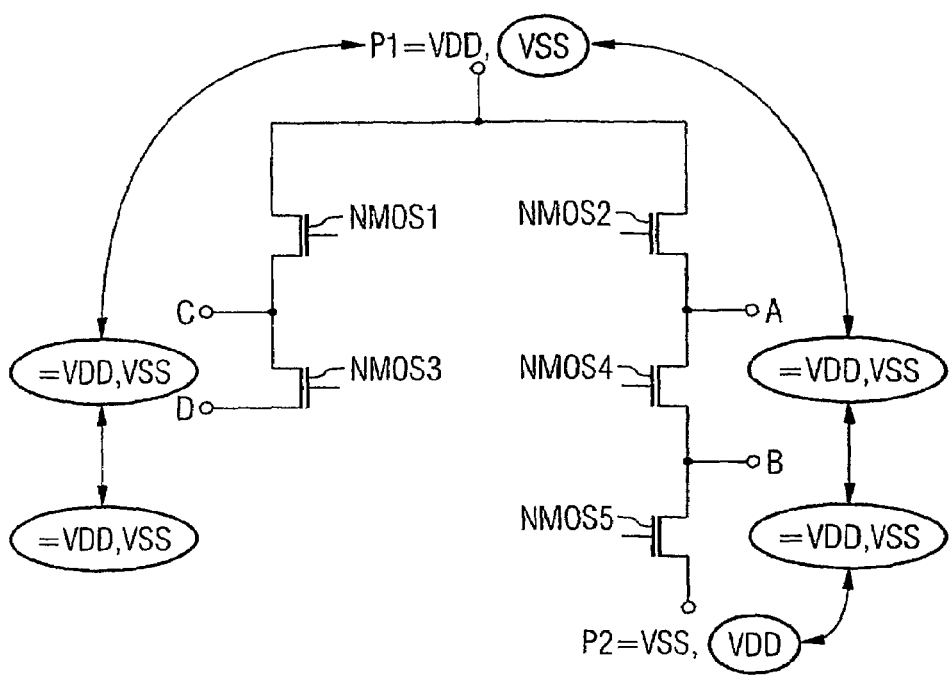
FIG. 17 shows a further exemplary embodiment for an electric circuit without "stop network"

FIG. 17 shows the exemplary embodiment according to FIGS. 15 and 16 in a modified form. In the electric circuit according to FIG. 17, too, the potential VDD is assigned to network P1 and the potential VSS is assigned to network P2. In distinction to the exemplary embodiment according to FIGS. 15 and 16, however, this is not a fixed assignment so that the two networks P1 and P2 do not form stop networks. Thus, further, other potentials can also be assigned to the two networks P1 and P2 in addition to the previously allocated potentials VDD and VSS, respectively. The pin allocation and the pintypes of the networks and the short-circuiting can be defined, for example, by means of the following program lines:

```
ercDefines(
    defPins(
        pin "VSS" = "P2"
        pin "VDD" = "P1"
```

-continued

```
    )
    shortDevices(
        short "MOS"
    )
)
```

If the method explained in conjunction with FIGS. 15 and 16 is then applied here, the VSS allocated to network P2 will pass via the transistor NMOS5, treated as short-circuited, to network B and from there via transistor NMOS4, treated as short-circuited, to network A. In addition, the potential VSS will be able to pass to network P1 via the transistor NMOS2, treated as short-circuited, since network P1 no longer forms a stop network. From network P1, the potential VSS then passes via transistor NMOS1 to network C and via transistor NMOS3 from there to network D. The potential VSS can thus be present at all networks P1, P2, A, B, C and D.

Correspondingly, the potential VDD is then also allocated to networks A, B, C and D—as already discussed in the above exemplary embodiment—and beyond that via transistor NMOS5 to network P2 since network P2 also no longer forms a stop network.

As a result, all networks can exhibit in each case both potentials VSS and VDD. The following thus applies:

P1: VDD, VSS
P2: VDD, VSS
A: VDD, VSS
B: VDD, VSS
C: VDD, VSS
D: VDD, VSS

Networks P1, P2, A, B, C and D thus form an equivalence category.

Figure 18:
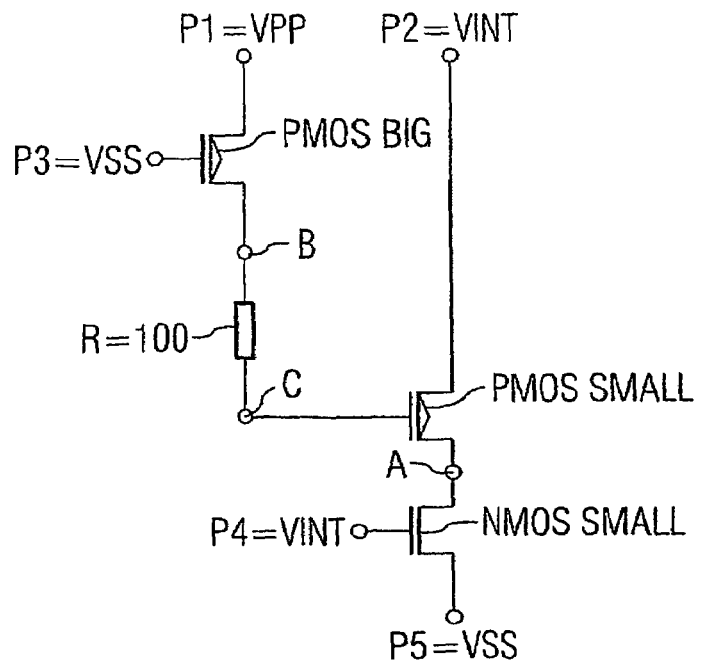
FIGS. 18 and 19 show a third exemplary embodiment for an electric circuit with "stop network;"
Figure 19:
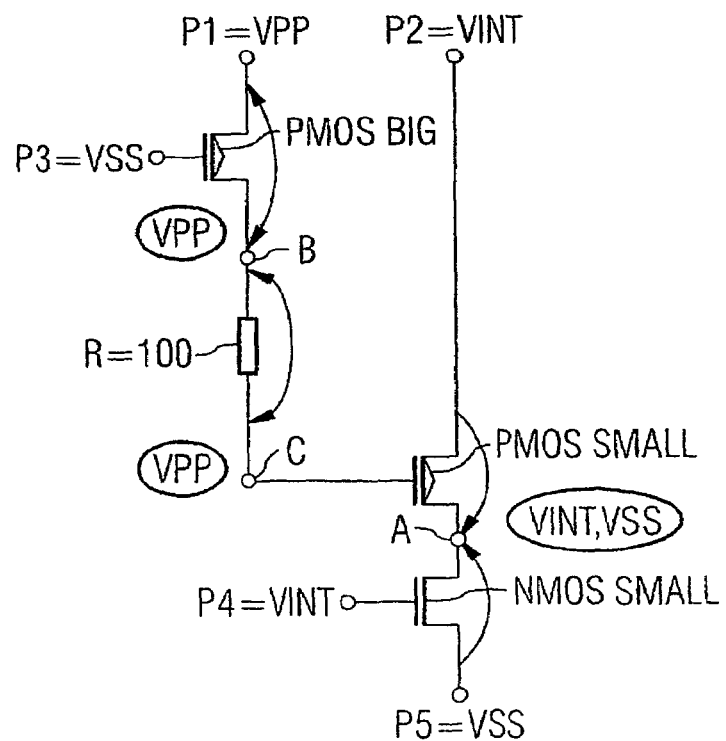

FIGS. 18 and 19 show a fifth electric circuit that will be used for explaining the performance of the test and marking method in the text that follows.

In FIG. 18, a "small" n-channel MOS field-effect transistor NMOS SMALL can be seen, one switching junction connection—the source connection—of which is connected to network P5. At network P5, the potential VSS is present. The gate of transistor NMOS SMALL is connected to P4 with the potential VINT. The other switching junction connection—the drain connection—of transistor NMOS SMALL is connected to one switching junction connection—the drain connection—of a "small" p-channel MOS field-effect transistor PMOS SMALL. The other switching junction connection—the source connection—of transistor PMOS SMALL is connected to a network P2 at which the potential VINT is present.

The gate connection of the transistor PMOS SMALL is connected via a resistance R to a switching junction connection of a "big" p-channel MOS field-effect transistor PMOS BIG, the other switching junction connection of which is connected to the network P1 with the potential VPP. The gate connection of the transistor PMOS BIG is connected to a network P3 to which the potential VSS is applied.

The networks P1, P2, P3, P4 and P5 are stop networks that can only exhibit the potential assigned to them.

All resistances of the electric circuit that have a resistance value of greater than 500Ω should be considered as nonconductive whereas all other resistances having a resistance value of less than or equal to 500Ω should be ideally or losslessly, conductive. Accordingly, the resistance R is treated as short-circuited.

The corresponding assignment of the potentials for networks P1, P2, P3, P4 and P5 and the definition of the electrical behavior of the components is achieved, for example, by means of the following programming rules:

```
/* Allocation of pintypes and voltages */
ercDefines(
    defPins(
        pin "VSS"      voltage 0       = "P5" "P3"
        pin "VINT"     voltage 2.0     = "P2" "P4"
        pin "VPP"      voltage 3.0     = "P1"
    )
    /* Definition of the devices via which the voltage is to be
transported, and of the stop networks */
    shortDevices(
        short "MOS" BIG
        short "MOS" SMALL
        short "RES" value =< 500
        excludingPinTypes "VPP" "VINT" "VSS"
    )
```

The circuit shown in FIGS. 18 and 19 is then to be checked to see whether too high a voltage can occur at the small p-channel transistor PMOS SMALL. The p-channel transistor PMOS SMALL is a transistor on which no voltage greater than VINT should be present between the gate connection and the source or drain connection, respectively. According to the above-mentioned definition, the voltage VINT=2 volts.

To carry out the test, it should first be determined which potentials or states should be allocated to which network nodes or which networks of the electric circuit. For this purpose, the following procedure is adopted:

Firstly, it is established that the network P2 is a stop network so that this network P2 can only exhibit the potential VINT. However, the potential VINT can reach the network A via the transistor PMOS SMALL that is to be treated as short-circuited with respect to its switching junction or its source-drain connection pair, respectively. In addition, the potential VSS should also be allocated to the network A because the transistor NMOS SMALL should also be considered to be short-circuited with respect to its switching junction or its source-drain connection pair, respectively.

The potential VPP at the network P1 passes via transistor PMOS BIG, which is to be treated as short-circuited with respect to its switching junction or its source-drain connection pair, respectively, to network B. Since the resistance R only has a resistance value of R=100Ω, this resistance is to be considered as short-circuited according to the above-mentioned rule. The potential VPP should thus also be allocated to the network C and thus to the gate connection of the transistor PMOS SMALL.

Thus, the allocation of potential shown in FIG. 19 is formed.

It is thus found that the potentials VSS and VINT can occur at network A, and thus at the drain connection of the transistor PMOS SMALL, and the potential VPP can occur at network C, and thus at the gate connection of the transistor PMOS SMALL.

The electric circuit is then to be checked to see whether a gate-source voltage or a gate-drain voltage that is greater than VINT is present at the "small" p-channel transistor PMOS SMALL. Such a test enquiry can look as follows, for example:

```
/* Test rule */
reportDevice(
    "MOS"
```
-continued
```
    models SMALL
    condition nodeVoltage (voltage "GATE" – voltage "SDRAIN" >
       "VINT") || nodeVoltage(voltage "SDRAIN – voltage "GATE" > "VINT")
    title "SMALL MOS, voltage difference Gate– Source/
       Drain/Substrate > VINT"
)
```

According to this test enquiry, a check is made whether there are "small" MOS field-effect transistors on which a voltage that exceeds the voltage limit of VINT=2 V is present between the gate connection and the source or drain connection, respectively.

The solution to this test enquiry can be seen directly in FIG. 19 because FIG. 19 shows that between the drain connection and the gate connection of the small p-channel transistor PMOS SMALL, a gate-drain voltage Ugd of Ugd=VPP−VSS=3 volts and Ugd=VPP−VINT=1 volt can be present.

If the potential VPP is applied to the gate connection, a voltage difference of Ugd=3 V>2 V can thus form between the gate connection and the drain connection. This clearly exceeds the predetermined limit voltage or maximum voltage difference of Ugd=VINT=2 V.

As a result of the test enquiry, the small p-channel transistor PMOS SMALL would thus be reported. The electric circuit according to FIGS. 18 and 19 is thus not adequately dimensioned. Instead of the small p-channel transistor PMOS SMALL, a "big" p-channel transistor PMOS BIG would have to be used since a voltage difference of VDD between gate and source or gate and drain connection would be uncritical in the case of an MOS transistor of the "big" type.

Instead, the electric circuit according to FIGS. 18 and 19 could also be modified differently, for example by increasing the resistance value of the resistance R. If the resistance value of the resistance R were to have a greater value than 500Ω, the potential VPP could not be "propagated" via this resistance R to the gate connection of the small p-channel transistor PMOS SMALL so that no overvoltage would occur at the transistor. The transistor would not be reported then.

In addition, the test method described can also take into consideration other parameters of the electric circuit. Thus, for example, an enquiry whether a predetermined limit voltage is exceeded at a transistor could be additionally associated with geometric parameters of the transistor. For example, the test method described could find all those "small" p-channel transistors at which a voltage difference that is greater than VINT is present between the source connection and the drain connection and the gate length of which is less than 280 nm. A corresponding test enquiry would look as follows, for example:

```
reportDevice(
    "MOS"
    models P_SMALL
    condition length < 280 &&
        nodeVoltage(voltage "SDRAIN" > "vint") &&
        nodeVoltage(voltage "SOURCE" – voltage "DRAIN > "vint)
    title "Small PMOS, length < 280, voltage SOURCE– DRAIN > vint"
)
```

Figure 20:
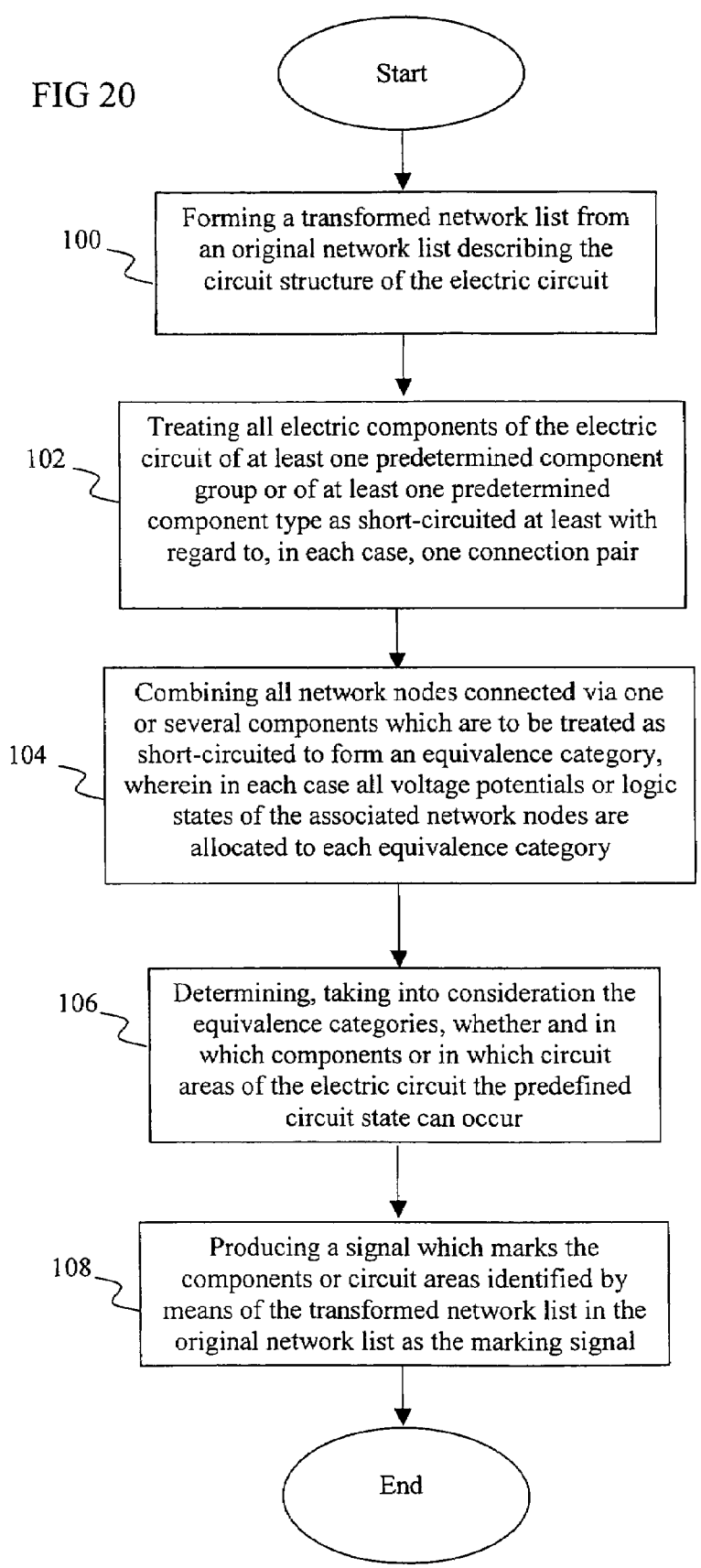
FIG. 20 is a flow chart of a preferred embodiment method.

FIG. 20 illustrates a flow chart of a preferred embodiment method. In step 100, a transformed network list is formed from an original network list describing the circuit structure of the electric circuit. In step 102, all electric components of the electric circuit of at least one predetermined component group or of at least one predetermined component type are treated as short-circuited at least with regard to, in each case, one connection pair. In step 104, all network nodes connected via one or several components, which are to be treated as short-circuited, are combined to form an equivalence category, wherein, in each case, all voltage potentials or logic states of the associated network nodes are allocated to each equivalence category. In step 106 it is determined, taking into consideration the equivalence categories, whether and in which components or in which circuit areas of the electric circuit the predefined circuit state can occur. In step 108, a signal that marks the components or circuit areas identified by means of the transformed network list in the original network list is produced as the marking signal.

Figure 21:
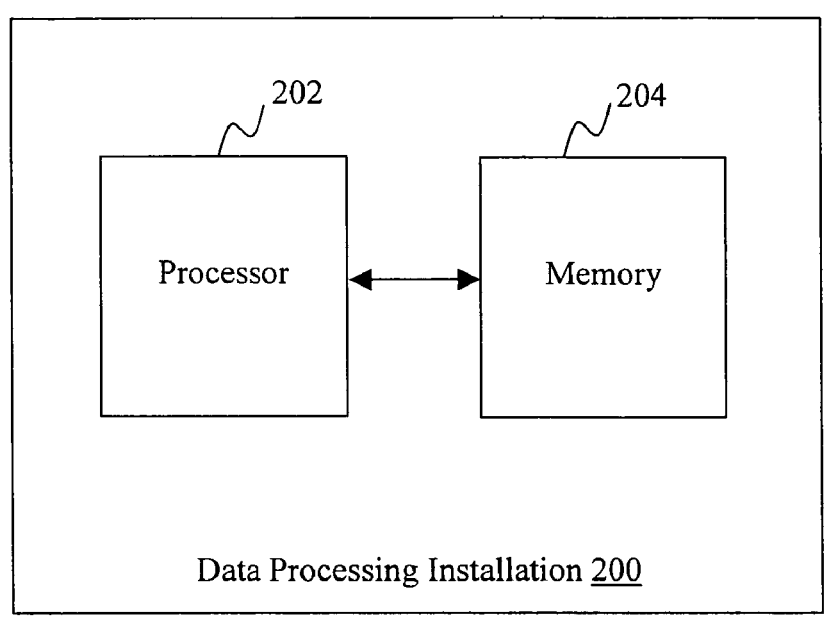
FIG. 21 is a block diagram of a preferred embodiment data processing installation.

FIG. 21 illustrates a block diagram of a preferred embodiment data processing installation 200. Data processing installation 200 includes a memory 204 for storing the circuit structure of an electrical circuit to be tested. Data processing installation 200 also includes processor 202 for executing a method of testing the electrical circuit. Processor 202 forms a transformed network list from an original network list describing the circuit structure of the electric circuit, wherein all electric components of the electric circuit of at least one predetermined component group or of at least one predetermined component type are treated as short-circuited at least with regard to, in each case, one connection pair, all network nodes connected via one or several components that are to be treated as short-circuited are combined to form an equivalence category, wherein, in each case, all voltage potentials or logic states of the associated network nodes are allocated to each equivalence category, it is determined, taking into consideration the equivalence categories, whether and in which components or in which circuit areas of the electric circuit the predefined circuit state can occur, and signal that marks the components or circuit areas identified by means of the transformed network list in the original network list is produced as the marking signal.

As a result, the embodiments described may thus be used for achieving a complete check of electric circuits in a very simple manner without requiring a complete electrical simulation of the circuit.

What is claimed is:

1. A method for producing a marking signal indicating at which components of an electric circuit or in which circuit areas of the electric circuit a predetermined circuit state defined at least by a voltage potential or a logic state could occur, the method comprising:

forming, by a computer, a transformed network list from an original network list describing the circuit structure of the electric circuit, wherein treating, by the computer, all electric components of the electric circuit of at least one predetermined component group or of at least one predetermined component type as short-circuited at least with regard to, in each case, one connection pair;

combining, by the computer, all network nodes connected via one or several components which are to be treated as short-circuited to form an equivalence category, wherein, in each case, all voltage potentials or logic states of the associated network nodes are allocated to each equivalence category;

determining, by the computer, taking into consideration the equivalence categories, whether and in which components or in which circuit areas of the electric circuit the predefined circuit state can occur; and producing, by the computer, a signal that marks the components or circuit areas identified by means of the transformed network list in the original network list as the marking signal.

2. The method as claimed in claim 1, wherein the original network list is used for verifying whether the predefined circuit state can actually occur in the marked components or in the marked circuit areas.

3. The method as claimed in claim 2, further comprising correcting the marking signal by forming a corrected marking signal, with respect to those components and circuit areas in which the verification shows that the predetermined circuit state is impossible.

4. The method as claimed in claim 1, wherein the network nodes or connection pins of the electric circuit which are permanently assigned an electric voltage potential or a logic state are excluded from being received in the equivalence category.

5. The method as claimed in claim 4, further comprising copying the voltage potential or the logic state of each network node with permanently assigned voltage potential or logic state into each of the equivalence categories in each case connected to the network node.

6. The method as claimed in claim 1, further comprising individually treating all electrical components of the electric circuit either as short-circuited or as nonconductive with respect to each connection pair of the component.

7. The method as claimed in claim 1, further comprising treating all transistors of at least one predefined transistor type as short-circuited with respect to their switching junction.

8. The method as claimed in claim 1, further comprising treating all resistances having a resistance value below a predetermined limit value as short-circuited and all resistances having a resistance value above the predetermined limit value as nonconductive.

9. The method as claimed in claim 1, wherein, as the predefined circuit state, a circuit state critical for the circuit is selected, particularly for a number of critical switching states, and the method is performed for the critical circuit state, particularly for a number of critical switching states.

10. The method as claimed in claim 1, wherein the marking signal is produced for those network nodes or equivalence categories that reach a predetermined limit voltage potential or reach a predetermined logic state.

11. The method as claimed in claim 1, wherein the marking signal is produced for those network nodes or equivalence categories that drop below a predetermined limit voltage potential or reach a predetermined logic state.

12. The method as claimed in claim 1, wherein the marking signal is produced for those network nodes or equivalence categories that exceed a predetermined limit voltage potential or reach a predetermined logic state.

13. The method as claimed in claim 1, wherein the marking signal is produced for those components at which a voltage is present that reaches a limit voltage individually predefined for the component.

14. The method as claimed in claim 1, wherein the marking signal is produced for those components at which a voltage is present that drops below a limit voltage individually predefined for the component.

15. The method as claimed in claim 1, wherein the marking signal is produced for those components at which a voltage is present that exceeds a limit voltage individually predefined for the component.

16. The method as claimed in claim 1, wherein the marking signal is produced for those components at which a voltage is present that reaches a limit voltage predefined for the respective component type.

17. The method as claimed in claim 1, wherein the marking signal is produced for those components at which a voltage is present that drops below a limit voltage predefined for the respective component type.

18. The method as claimed in claim 1, wherein the marking signal is produced for those components at which a voltage is present that exceeds a limit voltage predefined for the respective component type.

19. The method as claimed in claim 1, wherein the method is performed with the aid of a data processing system into which the circuit structure of the electric circuit is input as original network list.

20. A computer system for producing a marking signal indicating at which component of an electric circuit or in which circuit areas of the electric circuit a predefined circuit state defined at least by a voltage potential or a logic state might occur, the computer system comprising:
- a memory in which an original network list describing the circuit structure of the electric circuit is stored; and
- a processor, connected to the memory, which
    - forms a transformed network list from the original network list, whereby it
    - treats all electric components of the electric circuit of at least a predefined component group or of at least a predefined component type as short-circuited,
    - combines all network nodes, connected via one or several of the components to be treated as short-circuited, to form an equivalence category,
    - allocates to each equivalence category all voltage potentials or logic states of the associated network nodes,
    - determines, taking into consideration the equivalence categories, whether and at which components or in which circuit areas of the electric circuit the predetermined circuit state can occur, and
    - produces as the marking signal a signal that marks the components or circuit areas in the original network list identified by means of the transformed network list.

21. A data storage device comprising a program that is designed in such a manner that a data processing system performs, after installation of the program, the method comprising:
- forming a transformed network list from an original network list describing the circuit structure of an electric circuit, wherein
- treating all electric components of the electric circuit of at least one predetermined component group or of at least one predetermined component type as short-circuited at least with regard to, in each case, one connection pair;
- combining all network nodes connected via one or several components that are to be treated as short-circuited to form an equivalence category, wherein, in each case, all voltage potentials or logic states of the associated network nodes are allocated to each equivalence category;
- determining, taking into consideration the equivalence categories, whether and in which components or in which circuit areas of the electric circuit the predefined circuit state can occur; and
- producing a signal that marks the components or circuit areas identified by means of the transformed network list in the original network list as the marking signal.

* * * * *